United States Patent
Leizerovich et al.

[11] Patent Number: 5,880,633
[45] Date of Patent: Mar. 9, 1999

[54] HIGH EFFICIENCY POWER AMPLIFIER

[75] Inventors: Gustavo D. Leizerovich, Miami Lakes, Fla.; Lawrence F. Cygan, Schaumburg, Ill.

[73] Assignee: Motorola, Inc., Schaumburg, Ill.

[21] Appl. No.: 854,129

[22] Filed: May 8, 1997

[51] Int. Cl.[6] ............................................ H03F 1/34
[52] U.S. Cl. .................. 330/84; 330/124 R; 330/149; 330/295; 330/151
[58] Field of Search .................. 330/84, 124 R, 330/149, 151, 293; 332/123, 159, 160, 162; 375/297; 455/126

[56] References Cited

U.S. PATENT DOCUMENTS

| | | | |
|---|---|---|---|
| 4,546,326 | 10/1985 | Van Uffelen et al. ............... | 330/129 |
| 5,101,173 | 3/1992 | DiPiazza et al. .................... | 330/136 |
| 5,142,240 | 8/1992 | Isota et al. .......................... | 330/149 |
| 5,420,536 | 5/1995 | Faulkner et al. .................... | 330/149 |
| 5,420,541 | 5/1995 | Upton et al. ..................... | 330/295 X |
| 5,444,418 | 8/1995 | Mitzlaff ........................... | 330/151 X |

*Primary Examiner*—James B. Mullins
*Attorney, Agent, or Firm*—Val Jean F. Hillman

[57] ABSTRACT

A high efficiency power amplifier 600 consists of a non-linear radio frequency (RF) Doherty power amplifier (67) and a linearization circuit, such as, for example, a Cartesian Feedback circuit (33), an RF feedback circuit (38), an IF feedback circuit (48), or a feedforward circuit (55). The Doherty amplification stage (67) may be implemented with a BJTs, FETs, HBTs, H-FETs, PHEMTs, or any other type power transistor technology or device.

18 Claims, 6 Drawing Sheets

HIGH EFFICIENCY POWER AMPLIFIER

TECHNICAL FIELD

This invention relates in general to the improved linearization of non-linear amplifiers for the purpose of efficient Radio Frequency (RF) power amplification of RF signals containing amplitude or amplitude and phase modulation.

BACKGROUND

Increasing demand for mobile and personal communication services has renewed interest in spectrally efficient modulation schemes. Since the most efficient forms of RF power amplification are non-linear, CPM (Continuous Phase Modulation) schemes have been preferred for portable wireless applications (e.g. Gaussian Minimum Shift Keying-GMSK). Because of growing pressures for extra capacity however, the advantages of retaining a constant envelope are giving way to linear modulation (e.g. II/4 Digital Quadrature Phase Shift Keying (DQPSK) or Quad-16 Quadrature Amplitude Modulation (QAM)).

Although the filtering applied in linear modulation schemes generally produces gains in spectrum utilization, envelope variations are also introduced. Such signals when passed through non-linear RF amplifiers undergo distortion (Amplitude-to-Amplitude Modulation and Amplitude-to-Phase Modulation [AM/AM & AM/PM]) which results in a spreading of the spectrum beyond the allocated channel and reduced performance. The inefficiency of conventional linear RF amplifiers (e.g. Class A operated under appropriate back-off) would have a disastrous effect on the battery life of portable wireless transmitting equipment. Improvements in RF amplifier efficiency would directly lead to improvements in the talk-time recharging intervals, and size and weight of the overall wireless unit. The ideal amplifier for linear modulated portable systems is therefore a linear amplifier which is also power efficient.

Because linear amplifiers can amplify signals with any combination of amplitude and phase modulation, the choice of modulation scheme is not limited by the transmitter and hence can be software selectable. This is advantageous in military applications, and in commercial applications crossing international borders and standards. Other applications for linear amplifications include various digital cellular and Private Mobile Radio (PMR) systems, traditional Amplitude Modulation (AM), Single Side-Band (SSB) systems, instances where transmitter turn-on is to be well controlled such as bandlimited pulse systems found in radar and paging applications, and in Time Division Multiple Access (TDMA) systems. Linear Amplifiers can also accommodate the envelope variations caused by the combination of multiple signals such as those found in multi-carrier base stations.

Feedforward linearization is one way non-linear but efficient amplifiers can be linearized. Feedforward linearization is based on canceling the distortion of the amplifier at the output. The distortion or error signal is measured by comparing the amplifier output signal with the input. After suitable scaling and delay matching this error signal, which is out of phase with the distortion, is applied to the output resulting in a reduction in the distortion. The error signal must be amplified by a linear RF power amplifier however. This results in a compromise since in general, as the efficiency of an RF power amplifier increases, so does its distortion and hence the error signal level to be amplified by the linear amplifier. The larger the error signal level, the larger the linear amplifier and hence the greater the power consumption and the lower the efficiency. Such systems have been applied particularly for wideband linearization schemes. A typical example is disclosed by P. B. Kenington, M. A. Beach, A. Bateman and J. P. McGeeham in PCT Pat No. WO 91/16760.

It has long been known that feedback can linearize non-linear systems. Cartesian Feedback for example, which uses negative feedback to the baseband quadrature modulation provides excellent reduction in intermodulation distortion with low complexity and cost. A typical example of what is achievable with Cartesian feedback is given by M. Johannson and T. Mattsson, "Transmitter Linearization Using Cartesian Feedback for Linear TDMA Modulation", in the proceedings of the 41st IEEE Vehicular Technology Conference, St. Louis, U.S.A. VTC-91 pp. 439–444, May 1991. Other typical feedback techniques include Polar Feedback discussed in U.S. Pat. No. 5,023,937; IF (Intermediate Frequency) Feedback demonstrated by K. G. Voyce and J. H. McCandless, "Power Amplifier Linearization using IF Feedback", in the IEEE MTT-S digest, pp. 863–866, 1989; and RF Feedback demonstrated by H. A. Rosen and A. T. Owens, "Power Amplifier Linearity Studies for SSB Transmissions", IEEE Transactions on Communications Systems, pp. 150–159, June 1964.

High level modulation of the power supply of an RF power amplifier, for the purposes of amplitude (or envelope) modulation, is a well established technique which provides good power efficiency when combined with efficient high level power supply modulators. This is the basis for amplitude feedback only techniques of EP Pat. NO. 431201 FIG. 19 (also WO 9100653); of U.S. Pat. No. 3,900,823 FIGS. 1 and 2; of K. Chiba, to Nojima and S. Tomisato, "Linearized Saturation Amplifier with Bi-directional Control for Digital Mobile Radio", in the proceedings of Globecomm (IEEE), pp. 1958–1962, 1990; and of M. J. Koch and R. E. Fisher, "A High Efficiency 835 Mhz Linear Power Amplifier for Digital Cellular Telephony", in the proceedings of the 39th IEEE Vehicular Technology Conference, USA, VTC89, pp. 17–18, May 1989. The problem with these systems is the relatively larger bandwidths of the amplitude signals compared with corresponding baseband quadrature modulation and the inability to control AM-PM distortion. Consequently, the spectral control is generally inferior to that of Cartesian Feedback, IF Feedback and RF Feedback. Full Polar Feedback (both Amplitude and Phase feedback) overcomes the limitation of the inability to control AM-PM distortion, but still suffers from the bandwidth expansion problem on both the amplitude and phase signals.

Dynamic control of the DC gate bias has also been shown to improve amplifier efficiency by A. A. M. Saleh and D. C. Cox, "Improving the Power-Added Efficiency of FET Amplifiers Operating with Varying Envelope Signals", IEEE Transactions on Microwave Theory and Techniques, Vol. 31, January 1983. U.S. Pat. No. 4,631,491 also demonstrates that feedback can be used to control the collector and base bias in a Bipolar Junction Transistor based RF amplifier to improve the efficiency of the amplifier. More recently, U.S. Pat. No. 5,420,536 demonstrates that dynamic bias modulation may be used by an RF amplifier to maximize spectral control and reduce IF distortion.

DETAILED DESCRIPTION OF THE PREFERRED EMBODIMENT

Figure 1:
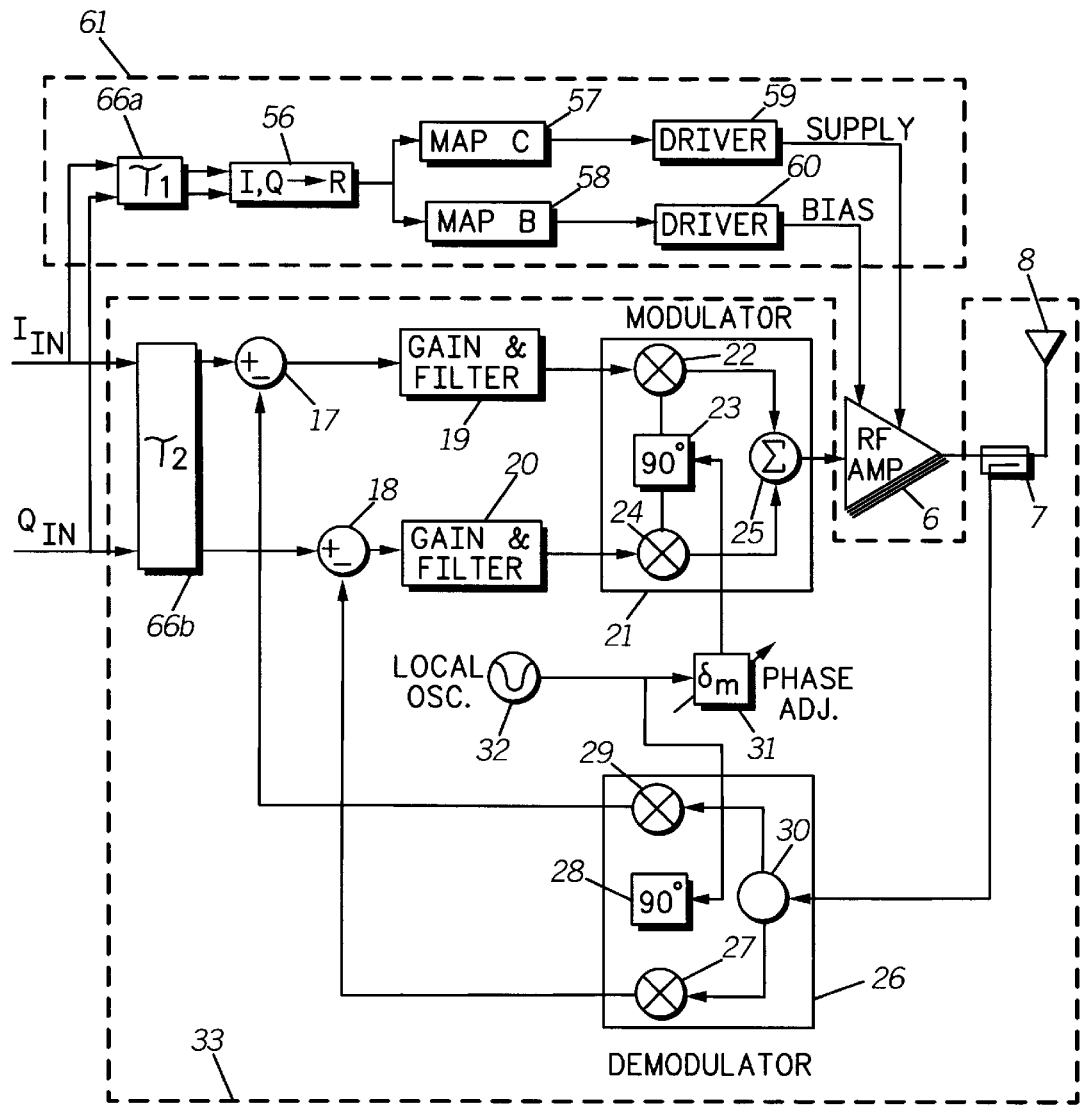
FIG. 1 is a block diagram showing a prior art Cartesian Feedback linearization scheme where the envelope is obtained from the quadrature inputs.

While the specification concludes with claims defining the features of the invention that are regarded as novel, it is believed that the invention will be better understood from a consideration of the following description in conjunction with the drawing figures, in which like reference numerals are carried forward.

The detailed description set forth below in connection with the appended drawings is intended merely as a description of the presently preferred embodiments of the invention, and is not intended to represent the only form in which the present invention may be constructed or utilized (e.g. the use of FETs or valves instead of BJT active devices). The description describes the implementation of the invention only in connection with the illustrated embodiments. It is to be understood, however, that the implementation of the invention can be accomplished by different electronic embodiments and it is intended these be encompassed within the spirit and scope of the invention.

In order to fully appreciate the present invention, a review of the prior art is advisable. The reader's attention is first directed to FIG. 1. In order to achieve the objective of efficient linear RF amplification, an efficient but non-linear RF amplifier 6 is often utilized as the basis for the art. This amplifier can be based on a range of active devices such as BJTs, FETs, and Valves. It can also be based on different classes of operation e.g., Class AB, B, C, D, E, or F and others. The prior art embodiments described herein are based on a BJT RF power amplifier with the operating class dependent on the base bias voltage.

It has long been known that negative feedback can linearize non-linear systems. To linearize RF amplifiers, the negative feedback can be formed a number of ways; namely, at RF or IF, or at baseband in the form of Polar representation or Cartesian representation. FIG. 1, depicts a first prior art embodiment of a linearized power amplifier. A standard Cartesian feedback loop is represented by 33. Dynamic bias circuit 61 represents the additional components which give the added efficiency improvements to the Cartesian Feedback System.

During operation, the quadrature input signals are applied to an envelope determining circuit 56. This circuit essentially determines the envelope "R" from I and Q, from the simple Pythagorean equation:

$$R = \sqrt{I^2 + Q^2}$$

Figure 2:
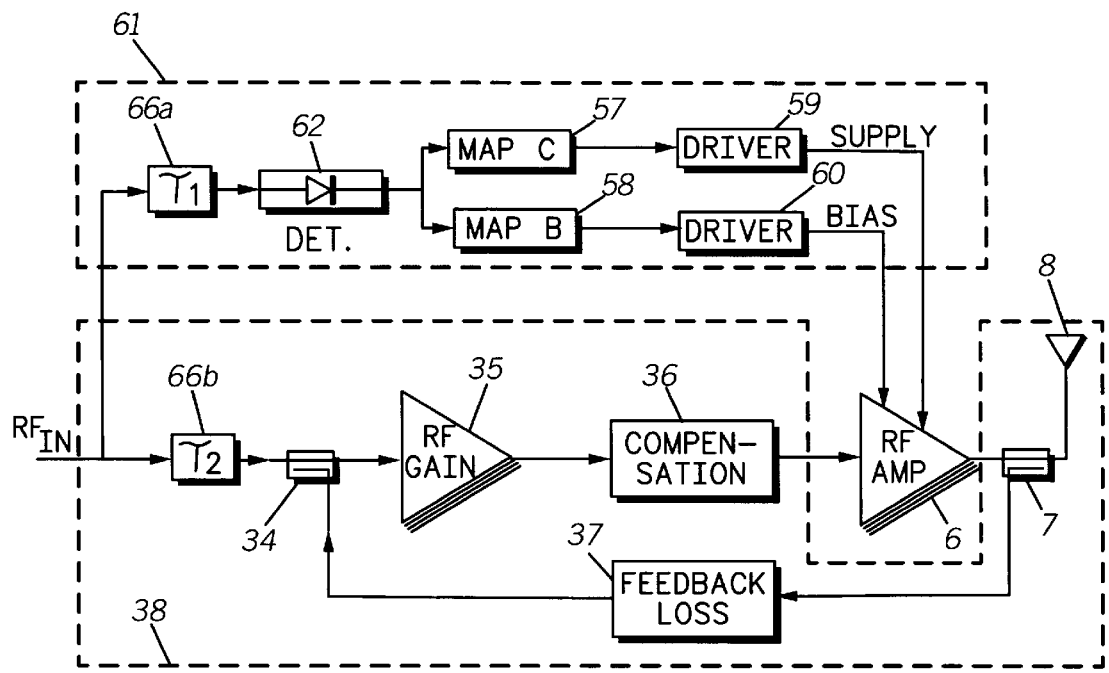
FIG. 2 is a block diagram of a prior art RF feedback linearization scheme where the envelope is obtained by RF detection.
Figure 3:
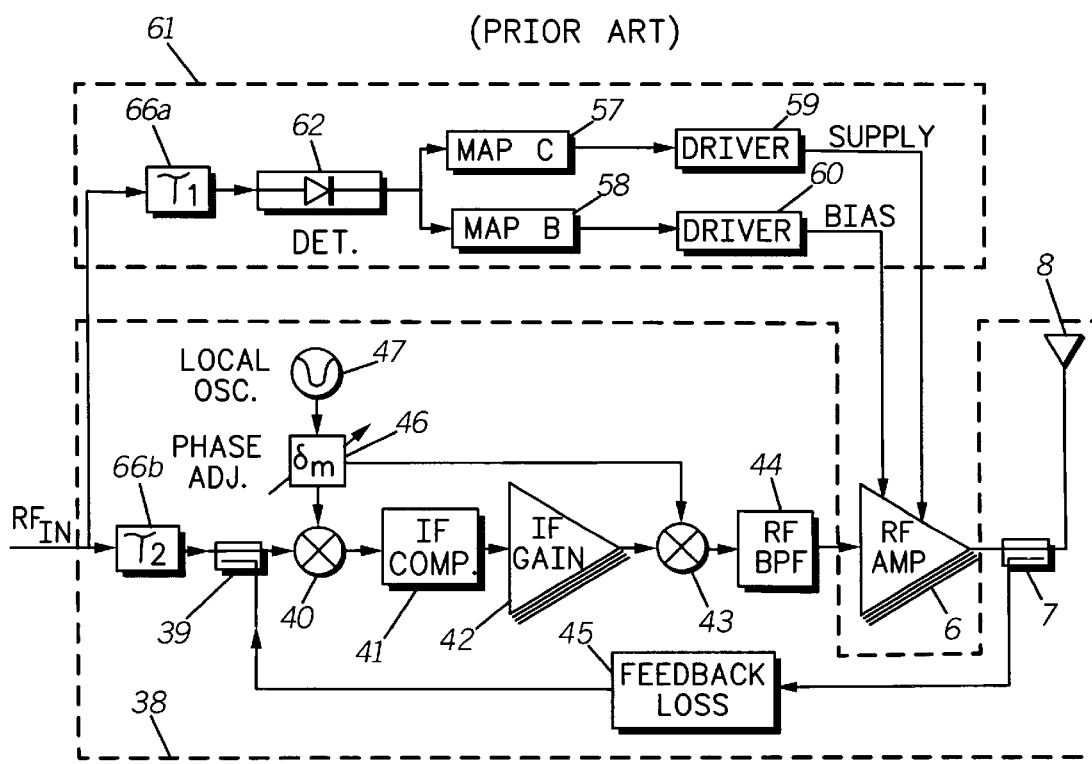
FIG. 3 is a block diagram of prior art IF feedback linearization scheme where the envelope is obtained by RF detection

The envelope determining circuit 56 may range from a digital signal processor (DSP) circuit where "R" can be obtained via calculation or look-up table, to an analog computing circuit or even an RF envelope detecting circuit 62 (FIGS. 2 and 3).

Once the "R" signal is obtained it is modified by functions 57 and 58 which select the optimum RF amplifier power supply voltage and DC bias voltage for the desired output RF envelope level. These function were precomputed and obtained from the measured characteristics of the amplifier. The resultant signals from these functions are then applied to the RF power amplifier by power supply drivers 59, 60. These drivers used in accordance with the present invention may utilize a switched mode power supply for 59, although other electronic embodiments such as resonant, semi-resonant, or multi-resonant supply converters, Class D modulators etc. could be utilized, and a linear driver for 60. It is also possible due to the toleration of the high level power supply modulation in exactness, to switch in different power supply rails for 59.

In general, the signal delay through the dynamic bias circuits 61 is different to that of the linearization circuitry. Consequently, it is possible to improve the operation of the dynamic bias circuit 61 by introducing delay blocks 66a and 66b to equalize the difference in the signal paths. It must be stated that these delay blocks are optional and that the preferred embodiments of the invention described in this disclosure encompass both embodiments with the delay blocks of 66a and 66b and embodiments without the delay blocks of 66a and 66b. Also, if delay is to be equalized, only one delay block is generally required. That delay block is added in the signal path which offers the smallest delay so that the overall delay in that signal path is brought up to the delay of the other larger delay signal path.

A second prior art embodiment, FIG. 2 shows the application of the dynamic bias circuitry 61 to the RF feedback linearization 38. The only difference between the operation of the systems of FIG. 1 and FIG. 2 is the manner by which "R" is obtained. In FIG. 2, "R" is obtained by an envelope detection circuit 62. The improvements in efficiency obtained with this system stems from the same reasons as discussed previously; namely, the dynamic bias circuitry 61 selects the best operating bias for a given output signal and the RF feedback adjusts the input predistortion to the amplifier to achieve exact linearization.

FIG. 3 is a block diagram which demonstrates a third prior art embodiment as applied to IF feedback. Again the operation and efficiency improvements given by the dynamic bias circuitry 61 is the same as the previous embodiments.

Figure 4:
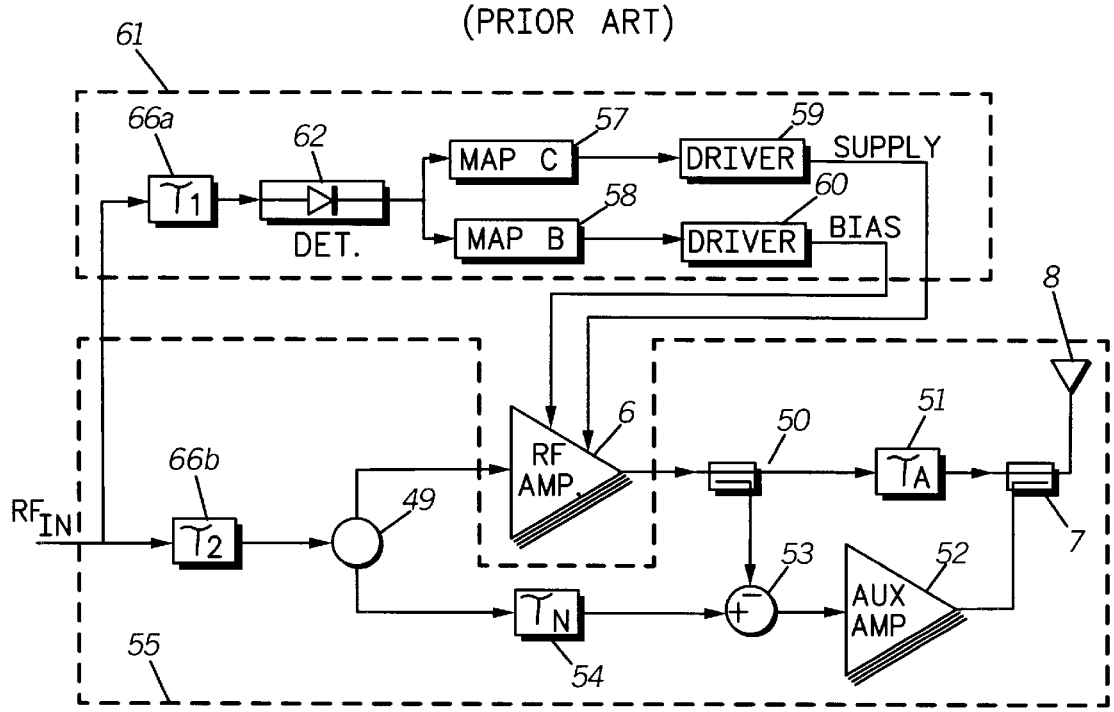
FIG. 4 is a block diagram of a prior art feedforward linearization scheme where the envelope is obtained by RF detection.

Another prior art embodiment as applied to an amplifier with feed forward is shown in FIG. 4. The dynamic bias circuitry 61 is applied to the RF amplifier 6 as with the previous embodiment. The advantage of the dynamic bias circuitry 61 as applied to feedforward linearization 55 stems both from the improvement in efficiency of the main RF amplifier 6 and also the linearization of the RF amplifier 6. Since the RF amplifier is made less non-linear by the application of 61. The auxiliary linear amplifier 52 can be made smaller and so consume less power. Consequently, the efficiency of the overall feedforward system is improved.

Figure 5:
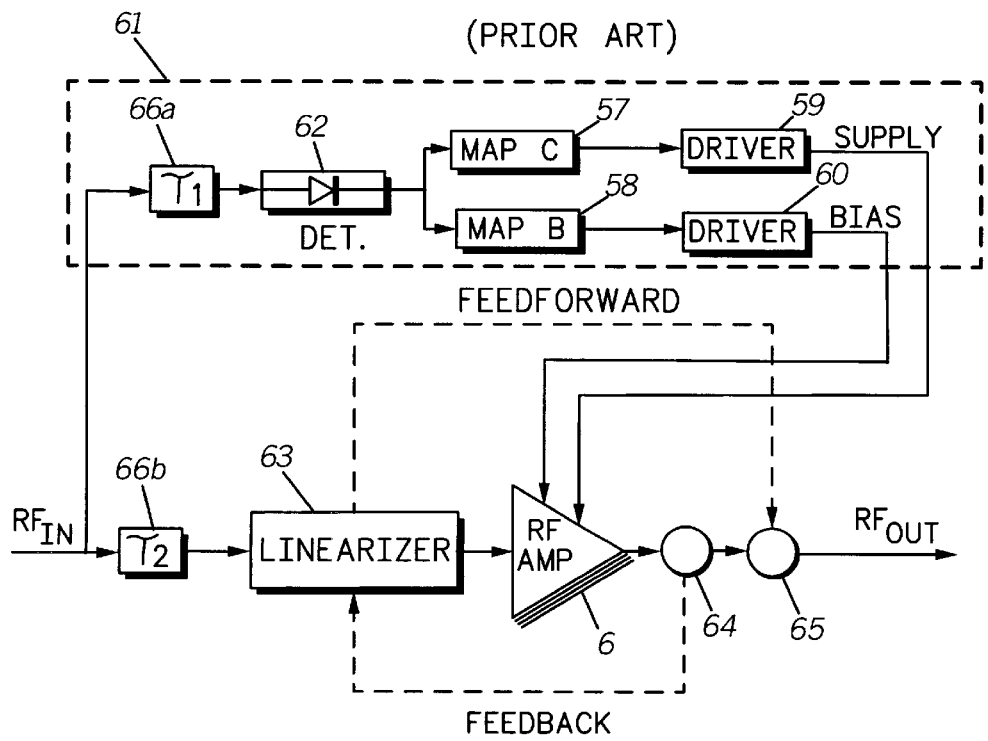
FIG. 5 is a block diagram of yet another prior art scheme showing how RF detection is applied generically to a linearization scheme.

FIG. 5 illustrates another embodiment according to the prior art. The linearization scheme is shown as a generic block 63 which can utilize both feedback and feedforward control to linearize the RF amplifier 6 by application of a predistorting drive signal to the RF amplifier and/or by addition of a distortion canceling signal 65 at the output. A coupling means 64 is provided by which the feedback signal can be obtained.

As shown with the previous prior art embodiments, the dynamic bias circuitry 61 is applied to the RF amplifier's bias and supply lines. By forcing these lines to a level known to give the best operating efficiency by Maps 57, 58 the linearization automatically adopts the necessary state to maintain linearization.

Figure 6:
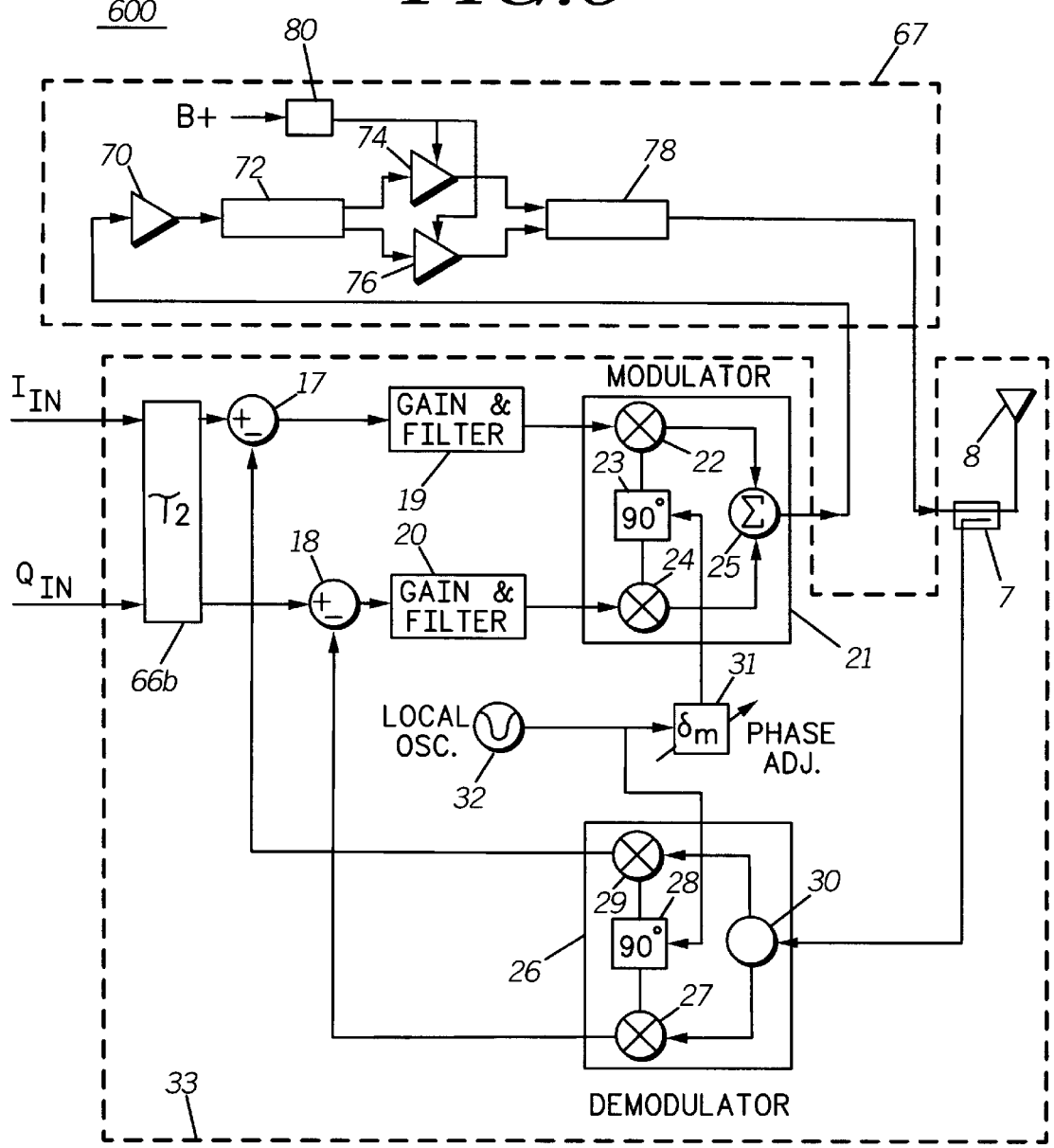
FIG. 6 is a block diagram of high efficiency power amplifier in accordance with the present invention.

FIG. 6 is a diagram showing a preferred embodiment of a high efficiency power amplifier 600 in accordance with present invention. Like the prior art, power amplifier 600 has particular applicability for use within the transmitter circuit of an RF communications device (not shown) such as a two-way radio, cellular telephone, cordless telephone, base station equipment, radio repeater, and the like.

As depicted the device 600 employ the Cartesian feedback circuit 33 of FIG. 1 as the preferred linearization technique. Upon closer inspection, a Doherty amplifier circuit 67 represents the additional components which give added efficiency improvement to the amplifier circuit 600 of the present invention. In accordance, the Doherty amplifier circuit 67 replaces the RF amplifier 6 as well as the dynamic bias circuit as taught by the prior art.

The Doherty amplifier stage 67 comprises a driver 70 coupled to the modulator 21 of linearization circuit 83. The driver 70 presents the modulator 21 output to a splitter circuit 72. Splitter 72 feeds the Doherty peaking amplifier 74 and the carrier amplifier 76 with respective input signals. In accordance with the preferred embodiment, splitter 72 is a 90 degree splitter, such that the signal applied to the carrier amplifier 76 is 90 degrees out of phase with the signal as applied to peaking amplifier 74. Thereafter, outputs from peaking amplifier 74 and carrier amplifier 76 are combined by combiner 78 and then routed to RF coupler 7 which feeds antenna 8.

In accordance with the preferred embodiment, the power amplifier 600 of the present invention is anticipated for use in a hand-held, battery powered two-way radio communications device with telephone interconnect, short message service (SMS), and radio dispatch capabilities. The device in question is designed to operate over a plurality frequencies. In a first set, operating frequencies range from 800 megahertz (MHz) to 900 MHz, the optimum frequency band of operation being between 806 MHz and 824 MHz.

In a second set, operating frequencies range from 1.4 gigahertz (GHz) to 1.6 GHz, the optimum frequency band of operation being between 1.453 GHz and 1.525 GHz. In addition, the device output power operating range is typically 5 milliwatts (mw) to 10 watts (W).

Figure 7:
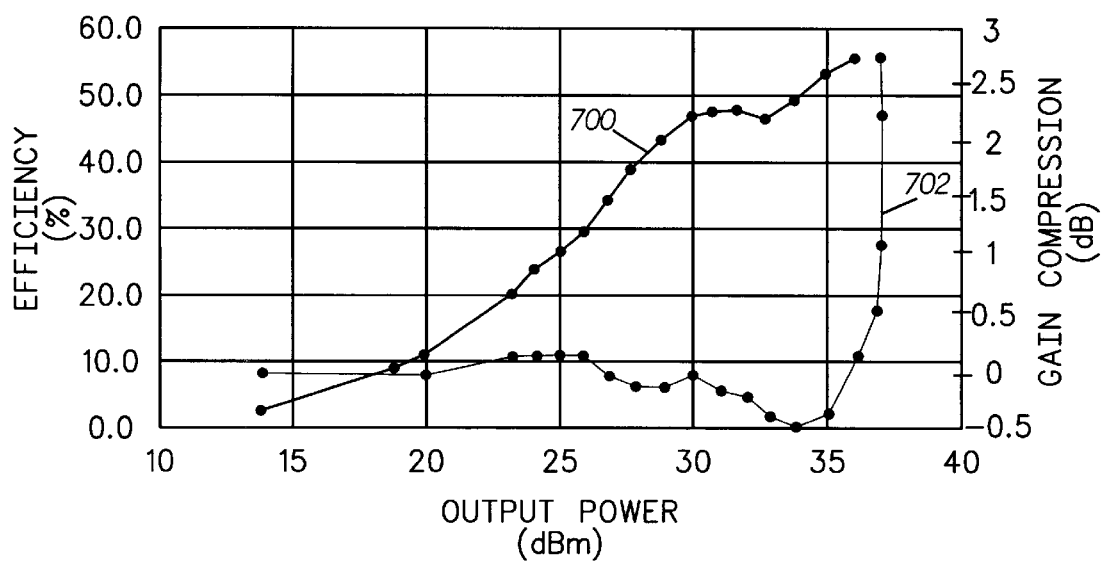
FIG. 7 illustrates the compression and efficiency characteristics of the power amplifier of FIG. 6.
Figure 8:
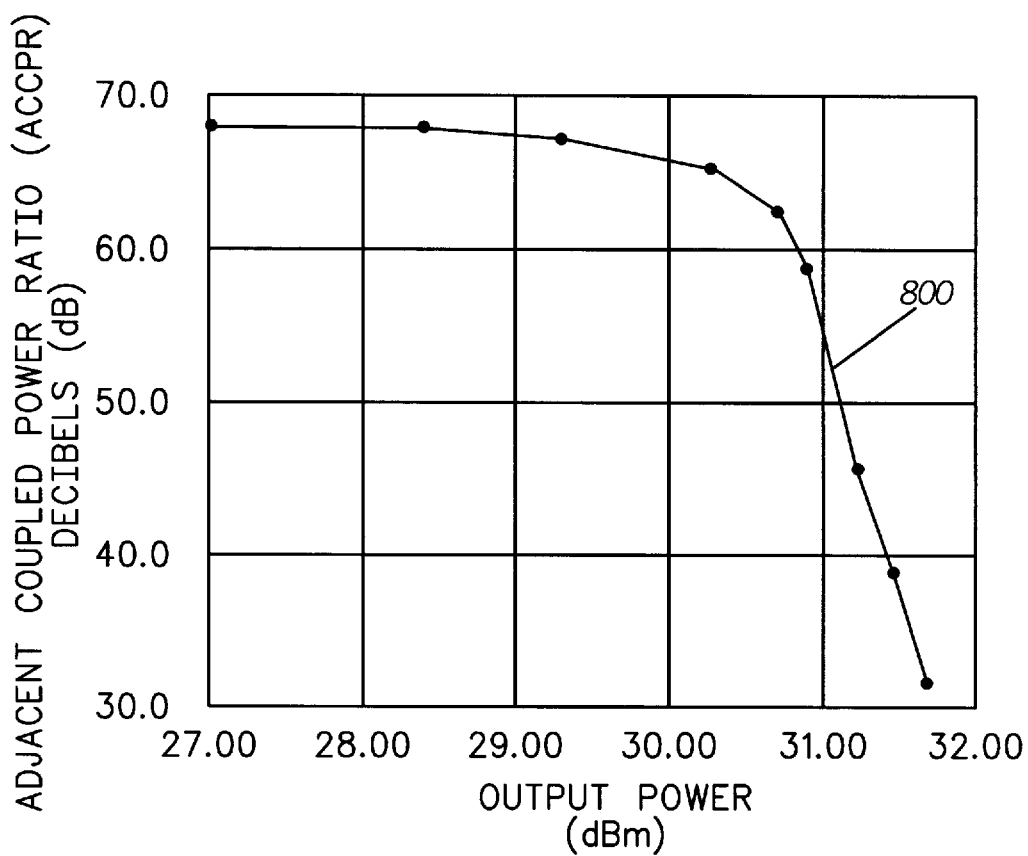
FIG. 8 illustrates the adjacent coupled power ratio performance (ACCPR) of the power amplifier of the present invention.

The advantages of this invention are demonstrated in FIGS. 7 and 8. FIG. 7 illustrates the compression and efficiency characteristics of the Doherty amplifier of FIG. 6. It will be appreciated by those skilled in the art that the efficiency holds even during back-off from saturation. This makes the present embodiment an attractive solution for use in association with modulation schemes with high peak to average power ratios.

As illustrated, the curve 700 represents Doherty amplifier power added efficiency versus single tone output power. The curve 702, on the other hand, represents Doherty amplifier gain compression versus single tone output power.

The curve 800 of FIG. 8 shows the adjacent coupled power ratio performance (ACCPR) of the preferred embodiment of the present invention. As will be appreciated, both high linearity and high efficiency are obtained.

While the preferred embodiment of the invention have been illustrated and described, it will be clear that the invention is not so limited. Numerous modifications, changes, variations, substitutions and equivalents will occur to those skilled in the art without departing from the spirit and scope of the present invention as defined by the appended claims. For example, while splitter 72 provides a 90 degree phase shift, it will be appreciated by those skilled in the art that other phase shift values and devices may be substituted therefore e.g., a 45 degree splitter. While the anticipated transistors selected for the peaking amplifier 74 and carrier amplifier 76 are hetero junction bipolar transistors (HBT), other devices may be substituted therefore. Available alternatives include, but are not limited to, field effect transistors (FETs), heterostructure field effect transistors (H-FETs), bipolar junction transistors (BJTs), pseudomorphic high electron mobility transistor (PHEMT), or any other power amplifier technology or device.

Design choice alternatives include implementing peaking amplifier stage 74 and carrier amplifier stage 76 as respective multiple stage devices. Where wider ranges of efficiency are required, cascaded stages of peaking amplifier stages and carrier amplifier stages may be employed. In addition, the Doherty amplifier stage 67 of the present invention may be substituted by the circuit disclosed in U.S. Pat. No. 5,568,086, issued Oct. 22, 1996, assigned to the assignee of the present invention, and incorporated herein by reference. Moreover, while the linearization circuit 33 consists of a Cartesian feed back loop, other linearization schemes may be advantageously substituted therefore; namely, the RF feedback linearization circuit 38 of FIG. 2, the intermediate frequency (IF) feed back circuit 48 of FIG. 3, the feedforward linearization circuit 55 of FIG. 4, or the generic linearization block 63 of FIG. 5.

What is claimed is:

1. A high efficiency power amplifier comprising:
   a Doherty amplifier stage, having an input path, for amplifying an input signal and producing an output corresponding thereto, said Doherty amplifier stage exhibiting non-linear amplitude and phase characteristics; and
   a Cartesian feedback linearization circuit, coupled to the Doherty amplifier stage, said Cartesian feedback linearization circuit responsive to receipt of the output for generating an error signal that is subtracted from the input path in order to linearize and correct the non-linear amplitude and phase characteristics of the output.

2. A high efficiency power amplifier according to claim 1 wherein said Doherty amplifier stage comprises transistors selected from the group consisting of:
   field effect transistor (FET) devices;
   heterostructure field effect transistor (H-FET) devices;
   bipolar junction transistor (BJT) devices;
   hetero junction bipolar transistor (HBT) devices; and
   pseudomorphic high electron mobility transistor (PHEMT).

3. A high efficiency power amplifier according to claim 1 wherein said linearization circuit comprises a RF feedback linearization circuit.

4. A high efficiency power amplifier according to claim 1 wherein said linearization circuit comprises an intermediate frequency (IF) feedback linearization circuit.

5. A high efficiency power amplifier according to claim 1 wherein said Doherty amplifier stage operates over a plurality frequencies ranging from 800 MHz to 900 MHz.

6. A high efficiency power amplifier according to claim 1 wherein said Doherty amplifier stage operates over a plurality frequencies ranging from 1.4 GHz to 1.6 GHz.

7. A high efficiency power amplifier according to claim 1 wherein said Doherty amplifier stage provides a power out of between 5 milliwatts and 10 watts.

8. A high efficiency power amplifier circuit having an input path, said circuit comprising:

- a power splitter for receiving an input signal and providing a first and a second output signal, said first and said second output signal having a different phase;
- an amplifier stage, coupled to the power splitter, having a carrier amplifier for amplifying said first output signal and a peak amplifier for amplifying said second output signal;
- a combiner, coupled to the amplifier stage, for producing an output corresponding thereto, said output exhibiting non-linear amplitude and phase characteristics; and
- a Cartesian feedback linearization circuit, coupled to the combiner, said Cartesian feedback linearization circuit responsive to receipt of the output for generating an error signal that is subtracted from the input path in order to linearize and correct the non-linear amplitude and phase characteristics of the output.

9. A high efficiency power amplifier according to claim 8 wherein said carrier amplifier comprises a multiple stage device.

10. A high efficiency power amplifier according to claim 8 wherein said peak amplifier comprises a multiple stage device.

11. A high efficiency power amplifier according to claim 8 wherein said amplifier stage operates over a plurality frequencies ranging from 800 MHz to 900 MHz.

12. A high efficiency power amplifier according to claim 8 wherein said amplifier stage operates over a plurality frequencies ranging from 1.4 GHz to 1.6 GHz.

13. A high efficiency power amplifier according to claim 8 wherein said amplifier stage provides a power out of between 5 milliwatts and 10 watts.

14. A radio frequency (RF) communications device having a high efficiency power amplifier, said power amplifier comprising:

- a Doherty amplifier stage for amplifying an input and producing an output corresponding thereto, said Doherty amplifier stage exhibiting non-linear amplitude and phase characteristics; and
- a Cartesian feedback linearization circuit, coupled to the Doherty amplifier stage, said Cartesian feedback linearization circuit responsive to receipt of the output for linearizing and correcting the non-linear amplitude and phase characteristics of the output.

15. A radio frequency (RF) communications device according to claim 14 wherein said Doherty amplifier stage comprises a multiple stage device.

16. A radio frequency (RF) communications device according to claim 14 wherein said Doherty amplifier stage operates over a plurality frequencies ranging from 800 MHz to 900 MHz.

17. A radio frequency (RF) communications device according to claim 14 wherein said Doherty amplifier stage operates over a plurality frequencies ranging from 1.4 GHz to 1.6 GHz.

18. A radio frequency (RF) communications device according to claim 14 wherein said Doherty amplifier stage provides a power out of between 5 milliwatts and 10 watts.

* * * * *